US010609833B2

(12) United States Patent
Cheng

(10) Patent No.: US 10,609,833 B2
(45) Date of Patent: Mar. 31, 2020

(54) WATERPROOF HOUSING AND WATERPROOF ELECTRONIC DEVICE HAVING THE SAME

(71) Applicant: Chicony Power Technology Co., Ltd., New Taipei (TW)

(72) Inventor: Chao-Cheng Cheng, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 0 days.

(21) Appl. No.: 16/172,866

(22) Filed: Oct. 29, 2018

(65) Prior Publication Data

US 2020/0060037 A1 Feb. 20, 2020

(30) Foreign Application Priority Data

Aug. 20, 2018 (TW) .............................. 107128994 A

(51) Int. Cl.
*H05K 5/06* (2006.01)
*H05K 5/02* (2006.01)

(52) U.S. Cl.
CPC ........... *H05K 5/066* (2013.01); *H05K 5/0247* (2013.01)

(58) Field of Classification Search
CPC ..................................................... H05K 5/066
USPC .......................................................... 174/50
See application file for complete search history.

(56) References Cited

U.S. PATENT DOCUMENTS

| | | | |
|---|---|---|---|
| 7,789,696 B2 | 9/2010 | Umei et al. | |
| 9,570,838 B2 | 2/2017 | Tamaki et al. | |
| 9,723,737 B2 | 8/2017 | Lee et al. | |
| 2007/0032109 A1* | 2/2007 | Hung | H01R 13/6675 439/172 |
| 2011/0254450 A1 | 10/2011 | Bergholz et al. | |

(Continued)

FOREIGN PATENT DOCUMENTS

| | | |
|---|---|---|
| CN | 202772614 | 3/2013 |
| CN | 107611687 | 1/2018 |
| CN | 206893946 | 1/2018 |

(Continued)

OTHER PUBLICATIONS

"Office Action of Taiwan Counterpart Application", dated May 17, 2019, p. 1-p. 3.

*Primary Examiner* — Stanley Tso
(74) *Attorney, Agent, or Firm* — JCIPRNET

(57) ABSTRACT

A waterproof housing including a first case, a second case, a welded member, and a waterproof unit is provided. The first case includes a side wall and a groove. The side wall is disposed on an outer periphery of the first case. The groove is disposed on the side wall. The second case is disposed in correspondence with the first case, and the second case includes a first inner wall disposed at an inner side of the second case. The first inner wall and the side wall are disposed in correspondence with each other. The welded member is disposed in correspondence with the first case and the second case, and a joint direction of the welded member is different from an opening direction of the groove. The waterproof unit is disposed in the groove and is partially protruded from the side wall. The first case and the second case are jointed to each other via the welded member. The waterproof unit and the first inner wall are abutted against each other for sealing the first case and the second case.

18 Claims, 5 Drawing Sheets

(56) References Cited

U.S. PATENT DOCUMENTS

2016/0043497 A1    2/2016  Wang
2016/0190719 A1*   6/2016  Brzezinski ............. H01R 12/73
                                                         439/74

FOREIGN PATENT DOCUMENTS

| CN | 206992876  | 2/2018  |
|----|------------|---------|
| TW | M244437    | 9/2004  |
| TW | 201325385  | 6/2013  |
| TW | M492552    | 12/2014 |
| TW | I600227    | 9/2017  |
| WO | 2018013841 | 1/2018  |

* cited by examiner

WATERPROOF HOUSING AND WATERPROOF ELECTRONIC DEVICE HAVING THE SAME

CROSS-REFERENCE TO RELATED APPLICATION

This application claims the priority benefit of Taiwan application serial no. 107128994, filed on Aug. 20, 2018. The entirety of the above-mentioned patent application is hereby incorporated by reference herein and made a part of this specification.

BACKGROUND OF THE INVENTION

Field of the Invention

The invention relates to a waterproof housing and a waterproof electronic device having the same, and particularly relates to a waterproof housing which avoids the phenomenon of glue melting.

Description of Related Art

The existing electronic adapter with a waterproof function is formed by forming an accommodation groove on a surface of an upper cover or a lower cover of the electronic adapter, and then placing a waterproof rubber ring into the accommodation groove. Then, the upper cover and the lower cover are connected and abutted against each other by locking or ultrasonic welding to achieve the waterproof purpose.

However, the existing electronic adapters have the problems as follows: the upper cover or the lower cover needs to accommodate the waterproof rubber ring, so that the upper cover or the lower cover needs to reserve a wider wall thickness, which will consume more materials. Since the waterproof rubber ring is squeezed by the upper cover and the lower cover, when the upper cover and the lower cover are subjected to ultrasonic welding, the phenomenon of local glue melting is likely to occur, resulting in the decrease in the tightness and yield. The waterproof rubber ring is disposed between the upper and lower covers, so that the overall product height is increased.

Specifically, the ultrasonic welded region of the upper and lower covers and the waterproof rubber ring are parallel to each other and have the same direction. The external stress in a vertical direction is applied to the upper and lower covers to press the welded region during welding, the waterproof rubber ring is also pressed by the upper and lower covers simultaneously, so that the frictions between the upper cover and the waterproof rubber ring and between the lower cover and the waterproof rubber ring are increased. When the external force from the ultrasonic vibration is transmitted to the waterproof rubber ring, the friction between the waterproof rubber ring and the upper and lower covers is accordingly increased, resulting in the phenomenon of local glue melting between the waterproof rubber ring and the upper and lower covers caused by heat generated by friction. Thereby, the degree of sealing and waterproof effects of the waterproof rubber ring are decreased.

SUMMARY OF THE INVENTION

The invention provides a waterproof housing and a waterproof electronic device having the waterproof housing, which can improve the phenomenon of glue melting during welding and avoid problems such as insufficient waterproof tightness of the waterproof housing and the decrease in product yield.

The invention provides a waterproof electronic device including a waterproof housing and a power conversion unit. The waterproof housing includes a first case, a second case, a welded member, and a waterproof unit. The first case includes a side wall and a groove. The side wall is disposed on an outer periphery of the first case. The groove is disposed on the side wall. The second case is disposed in correspondence with the first case, and the second case includes a first inner wall disposed at an inner side of the second case. The first inner wall and the side wall are disposed in correspondence with each other. The welded member is disposed in correspondence with the first case and the second case, and a joint direction of the welded member is different from an opening direction of the groove. The waterproof unit is disposed in the groove and is partially protruded from the side wall. The power conversion unit is disposed in the first case and the second case. The first case and the second case are jointed to each other via the welded member, and the first case and the second case form an accommodation space together. The power conversion unit is disposed in the accommodation space, and the waterproof unit and the first inner wall are abutted against each other for sealing the first case and the second case.

The invention provides a waterproof housing including a first case, a second case, a welded member, and a waterproof unit. The first case includes a side wall and a groove. The side wall is disposed on an outer periphery of the first case. The groove is disposed on the side wall. The second case is disposed in correspondence with the first case, and the second case includes a first inner wall disposed at an inner side of the second case. The first inner wall and the side wall are disposed in correspondence with each other. The welded member is disposed in correspondence with the first case and the second case, and a joint direction of the welded member is different from an opening direction of the groove. The waterproof unit is disposed in the groove and is partially protruded from the side wall. The first case and the second case are jointed to each other via the welded member. The waterproof unit and the first inner wall are abutted against each other for sealing the first case and the second case.

Based on the above, in the waterproof housing of the present invention, the waterproof unit is disposed in the groove located at the side wall of the first case. Since the joint direction of the welded member is different from the opening direction of the groove, when the welded member is subjected to ultrasonic vibration welding, the external force from the ultrasonic vibration on the waterproof unit is smaller, thereby improving the phenomenon of glue melting between the waterproof unit and the first and second cases caused by heat generated by friction. Therefore, in the present invention, the waterproof unit is laterally disposed between the first case and the second case to reduce the influences of ultrasonic vibration and up and down pressing external force, so as to achieve the purposes of longer service life and better product yield.

In addition, the groove of the first case is disposed on the outer side wall. The groove type of the first case can reduce the thickness dimension of the second case to save material. Also, it is possible to reduce the stress compression trace between the upper cover and the lower cover of the prior art.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
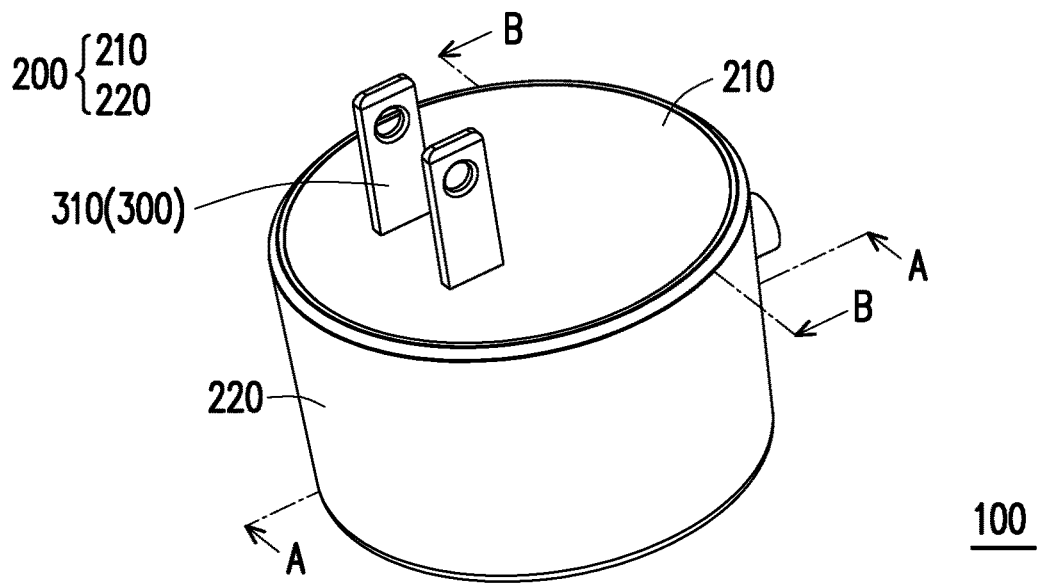
FIG. 1A is a schematic three-dimensional view of a waterproof electronic device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1A to FIG. 2B, a waterproof electronic device 100 of the present invention has the waterproof function and is suitable for use underwater surface or in a high humidity environment. Briefly, the waterproof electronic device 100 can avoid the invasion of moisture causing the internal electronic components to be damped, damaged, and so on. The waterproof electronic device 100 is, for example, a transmission line or a current conversion adapter electrical products, used to connect to a socket or other external power source. After the external power source is transformed and rectified, an appropriate value of voltage and current is converted to supply the corresponding electrical products.

The waterproof electronic device 100 of the present invention includes a waterproof housing 200 and a power conversion unit 300. The waterproof housing 200 includes a first case 210, a second case 220, a welded member 230, and a waterproof unit 240.

In the present embodiment, the first case 210 is a cover body connected to the power conversion unit 300, and the first case 210 includes a side wall SW and a groove G. The side wall SW is disposed on an outer periphery of the first case 210. The groove G is disposed on the side wall SW. Further, the groove G is surroundingly recessed on the side wall SW and perpendicular to an axial direction AD.

The second case 220 is disposed in correspondence with the first case 210. That is, the two can be connected to each other to be fixed. The second case 220 is an annular case accommodating the power conversion unit 300 and other electronic components.

The second case 220 includes a first inner wall W1 and a second inner wall W2. The first inner wall W1 is disposed at an inner side of the second case 220. The first inner wall W1 and the side wall SW of the first case 210 are disposed in correspondence with each other. Specifically, the first inner wall W1 surrounds outside of the side wall SW and are spaced apart from each other. The second inner wall W2 is connected to a lower edge of the first inner wall W1 and is relatively far away from the first case 210, and an inner diameter of the second inner wall W2 is smaller than an inner diameter of the first inner wall W1. Herein, the inner diameter of the second inner wall W2 is gradually tapered away from the first inner wall W1.

The welded member 230 is disposed in correspondence with the first case 210 and the second case 220, and a joint direction JD of the welded member 230 is different from an opening direction OD of the groove G. The waterproof unit 240 is disposed in the groove G and partially protruded from the side wall SW of the first case 210. Further, the waterproof unit 240 is a rubber ring or other material having elastic and moisture-proof characteristics, for example.

In the present embodiment, the joint direction JD is parallel to the axial direction AD, and the opening direction OD is perpendicular to the axial direction AD. This indicates that the joint direction JD and the opening direction OD are perpendicular to each other. In other embodiments, an included angle between the joint direction and the opening direction is greater than 0 degree and smaller than 180 degrees, for example. Herein, the invention is not limited thereto. The reason is that as long as the joint direction is different from the opening direction, the external force from the ultrasonic vibration transmitted along the axial direction AD on the waterproof unit can be effectively reduced, so as to reduce the friction between the waterproof unit and the first case and between the waterproof unit and the second case.

The power conversion unit 300 is disposed between the first case 210 and the second case 220. In short, the first case 210 and the second case 220 are jointed to each other by the welded member 230 (through ultrasonic welding technology), and the first case 210 and the second case 220 form an accommodation space AS together. The power conversion unit 300 is disposed in the accommodation space AS and connected to a bottom surface BS of the first case 210, and two plugs 310 of the power conversion unit 300 are penetrated and protruded outside of the first case 210.

The waterproof unit 240 and the first inner wall W1 of the second case 220 are abutted against each other along the opening direction OD for sealing the first case 210 and the second case 220, so as to achieve the waterproof effect.

Figure 2A:
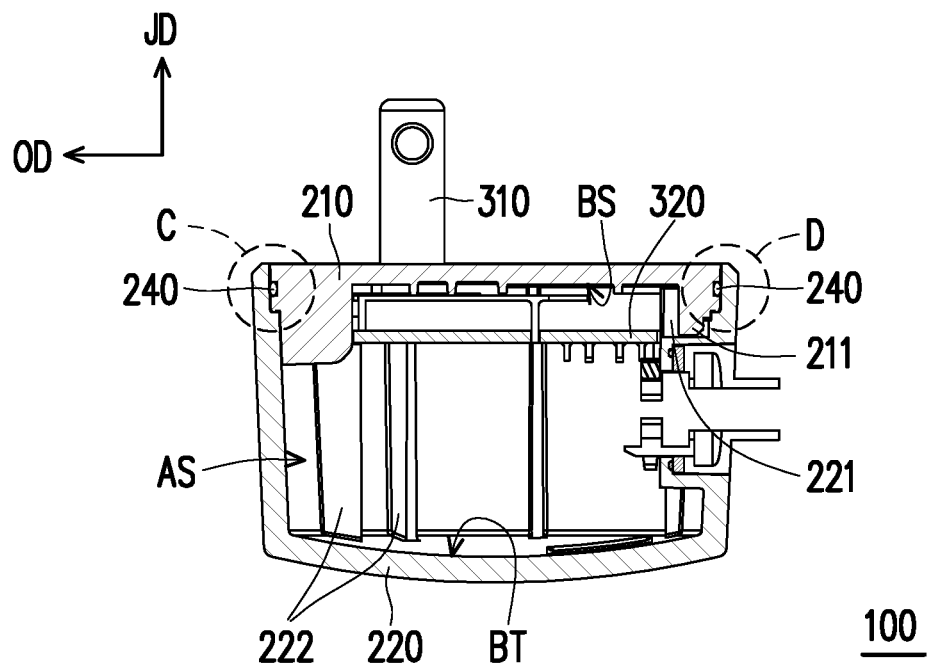
FIG. 2A is a schematic cross-sectional view of the waterproof electronic device of FIG. 1A taken along an A-A section line.
Figure 2B:
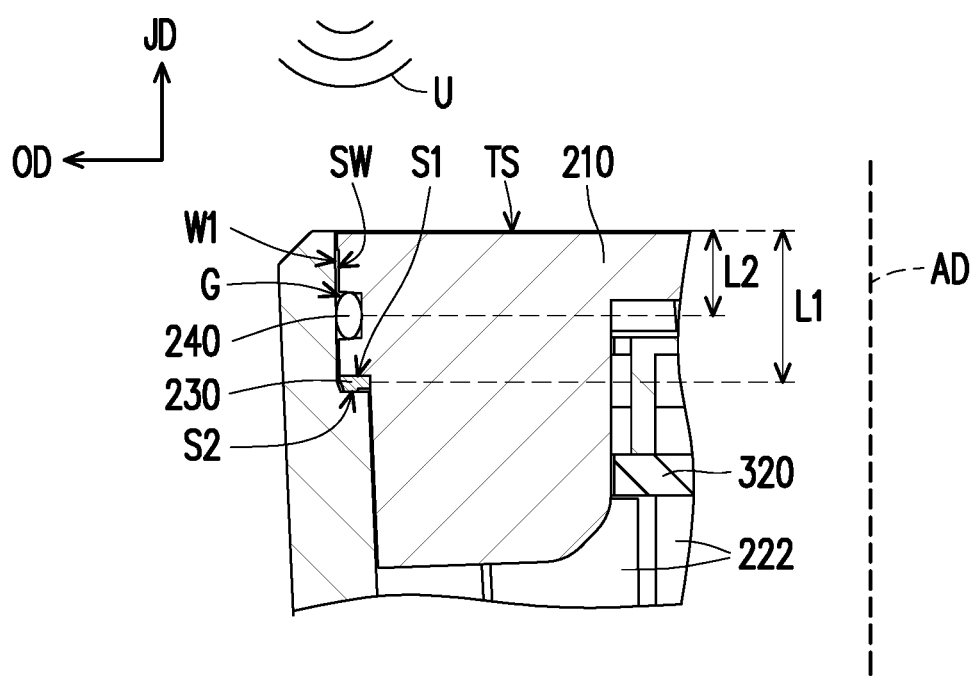
FIG. 2B is an enlarged schematic view of a C portion of the waterproof electronic device of FIG. 2A.
Figure 2C:
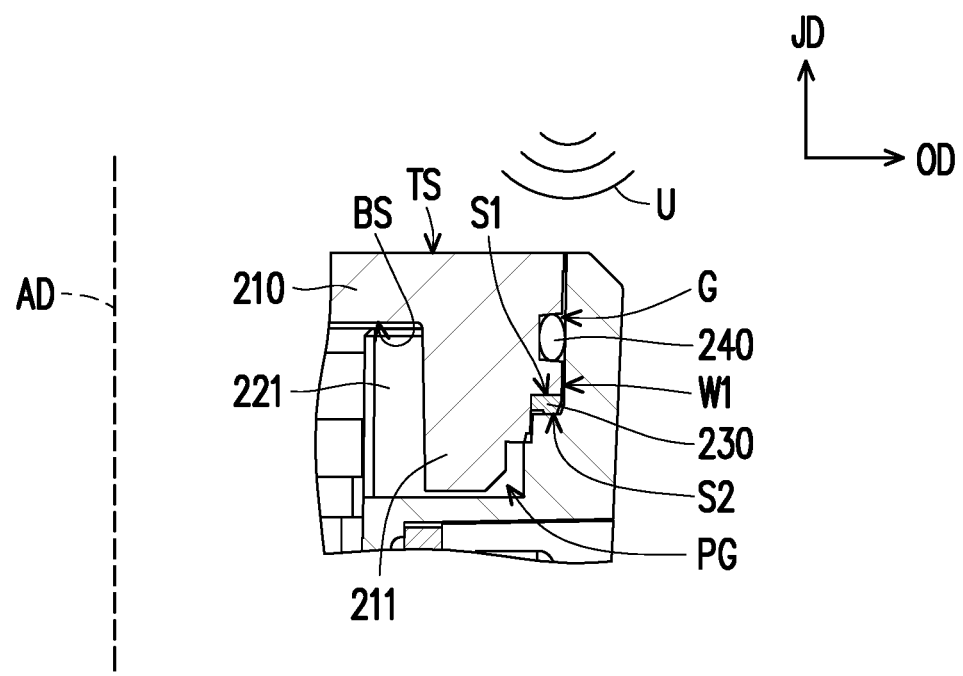
FIG. 2C is an enlarged schematic view of a D portion of the waterproof electronic device of FIG. 2A.
Figure 2D:
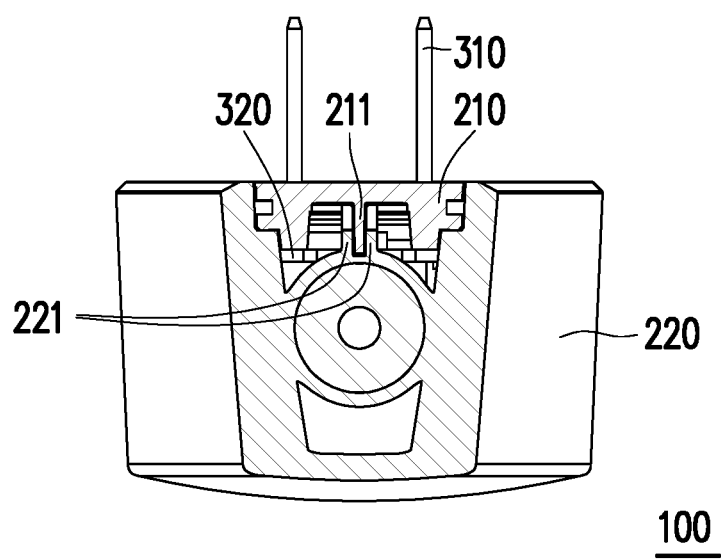
FIG. 2D is a schematic cross-sectional view of the waterproof electronic device of FIG. 1A taken along a B-B section line.

FIG. 2C is an enlarged schematic view of a D portion of the waterproof electronic device of FIG. 2A. FIG. 2D is a schematic cross-sectional view of the waterproof electronic device of FIG. 1A taken along a B-B line.

Referring to FIG. 2A to FIG. 2D, the first case 210 has a first welded surface S1 disposed at a bottom of the side wall SW and toward the second case 220. The second case 220 has a second welded surface S2 disposed at a bottom of the first inner wall W1 and aligned with the first welded surface S1. The welded member 230 is disposed between the first welded surface S1 and the second welded surface S2, and the welded member 230 is heated and melted to joint to the first welded surface S1 and the second welded surface S2 via ultrasonic U welding, wherein the welded member 230 is a thermoplastic material, for example.

Further, the first welded surface S1 and the side wall SW have a first included angle therebetween (greater than 90 degrees as an example in FIG. 2B), and the second welded surface S2 and the first inner wall W1 have a second included angle therebetween (greater than 90 degrees as an example in FIG. 2B). The actual angle of the first included angle and the second included angle may depend on the process or structural requirements, and the invention is not limited thereto.

Further, the bottom surface BS of the first case 210 is formed with a positioning block 211. The positioning block 211 is vertically extended toward the second case 220 and protruded from the first welded surface S1. The second case 220 has a positioning groove PG disposed in the second case 220 and located below the first inner wall W1. The positioning groove PG correspondingly accommodates the positioning block 211 to position the first case.

Specifically, the positioning groove PG is composed of two bumps 221 formed on the second inner wall W2. The two bumps 221 are used to restrict the movement of the positioning block 211, so as to ensure that there is no relative pivot between the first case 210 and the second case 220.

Figure 1B:
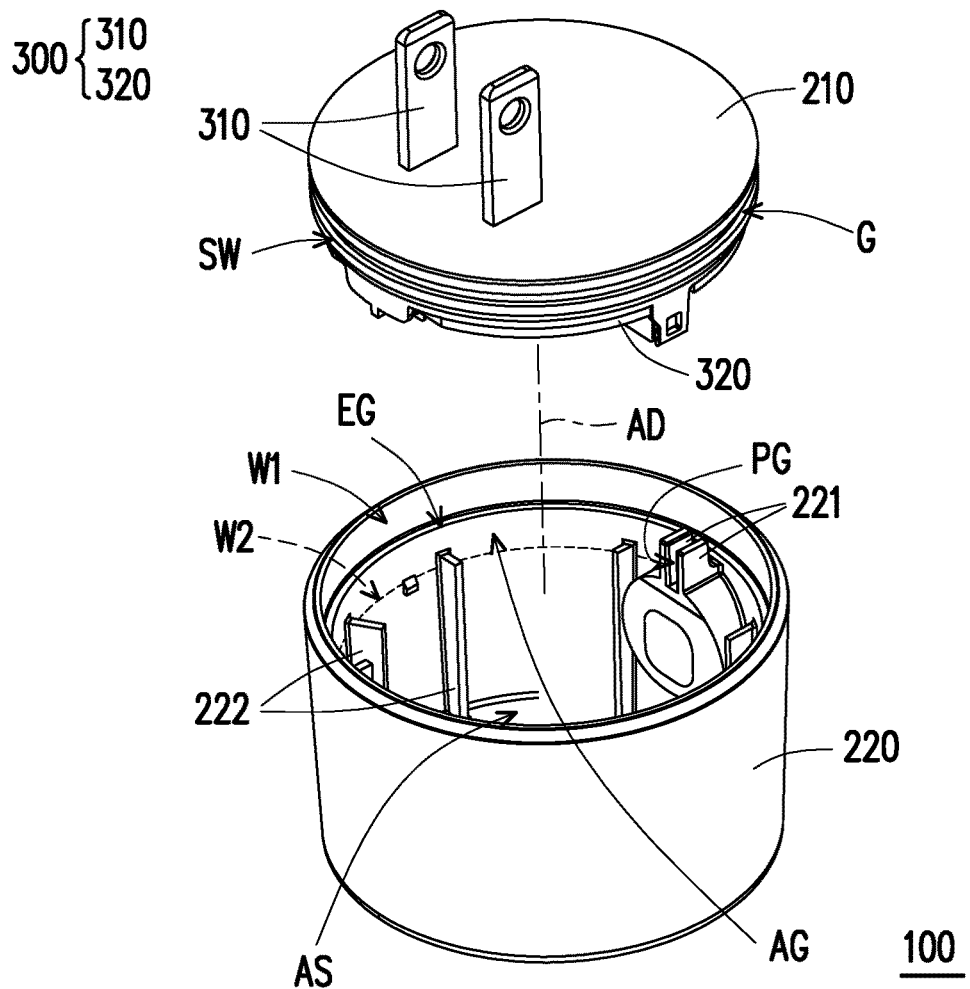
FIG. 1B is a schematic exploded view of components of the waterproof electronic device of FIG. 1A.
Figure 1C:
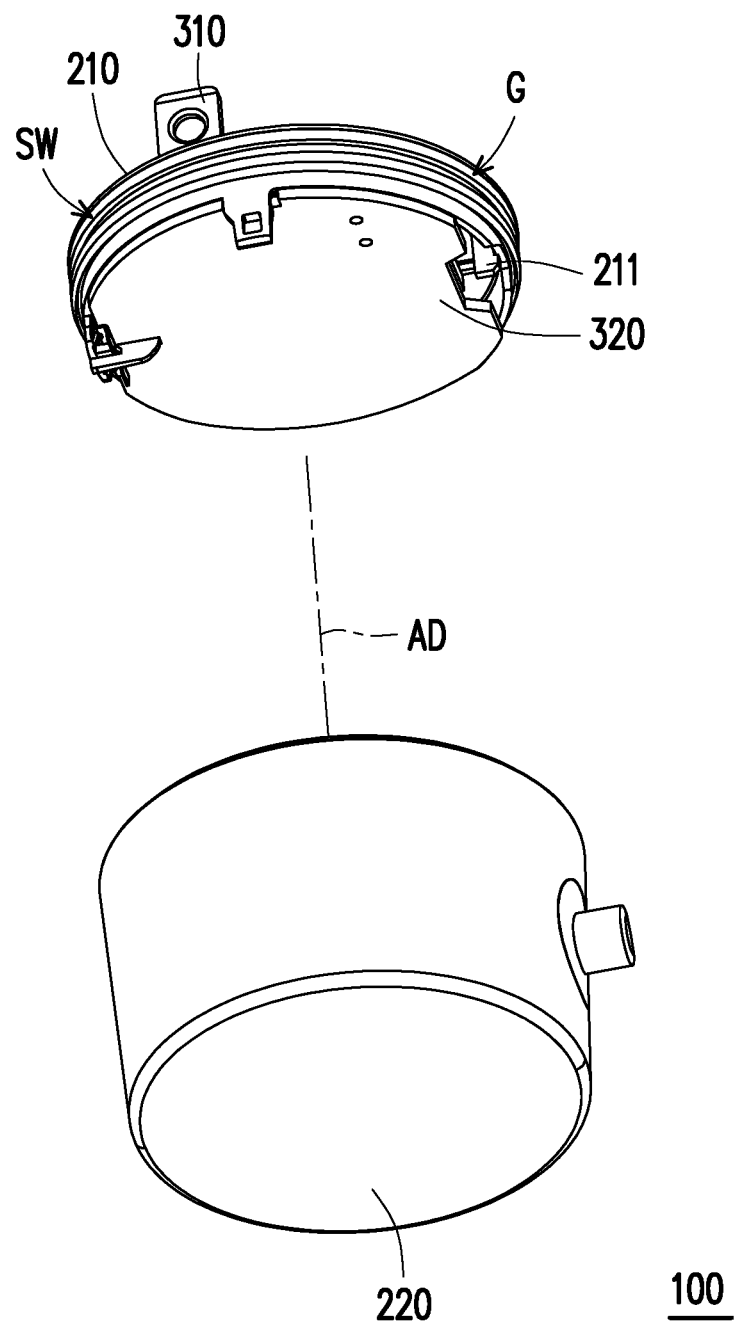
FIG. 1C is a schematic exploded view of the components of the waterproof electronic device of FIG. 1A in another direction.

Referring to FIG. 1B, FIG. 1C, and FIG. 2A, the second case 220 has at least one rib 222 (a plurality of ribs 222 as an example in FIG. 1B). Each of the ribs 222 is disposed on the second inner wall W2, and each of the ribs 222 is extended on the second inner wall W2 along the axial direction AD, so that two ends of each of the ribs 222 are respectively adjacent to an edge EG of the first inner wall W1 and a bottom surface BT of the second case.

An accommodating groove AG is formed between the plurality of ribs 222 and the edge EG of the first inner wall W1. A length dimension of the accommodation groove AG corresponds with (e.g., greater than) a thickness dimension of a circuit board 320 of the power conversion unit 300, so that the accommodation groove AG may fully accommodate and support the circuit board 320. After the first case 210 and the second case 220 are jointed to each other, the plurality of ribs 222 and the first case 210 clamp and fix the circuit board 320 of the power conversion unit 300. The circuit board 320 is suspended in the accommodation space AS herein.

Referring to FIG. 2A and FIG. 2B, further, an axial length L1 of the welded member 230 relative to a top surface TS of the first case 210 is greater than an axial length L2 of the groove G relative to the top surface TS of the first case 210. Herein, the position of the welded member 230 is ensured to be located below the waterproof unit 240. That is, the waterproof unit 240 is adjacent to a gap between the first case 210 and the second case 220. When the external moisture enters the waterproof housing 200 from the gap, it will be blocked by the waterproof unit 240 and unable to contact the welded member 230, so as to avoid the moisture accumulation in the welded member 230 causing the welding characteristics to be deteriorated due to dampness.

Figure 3:
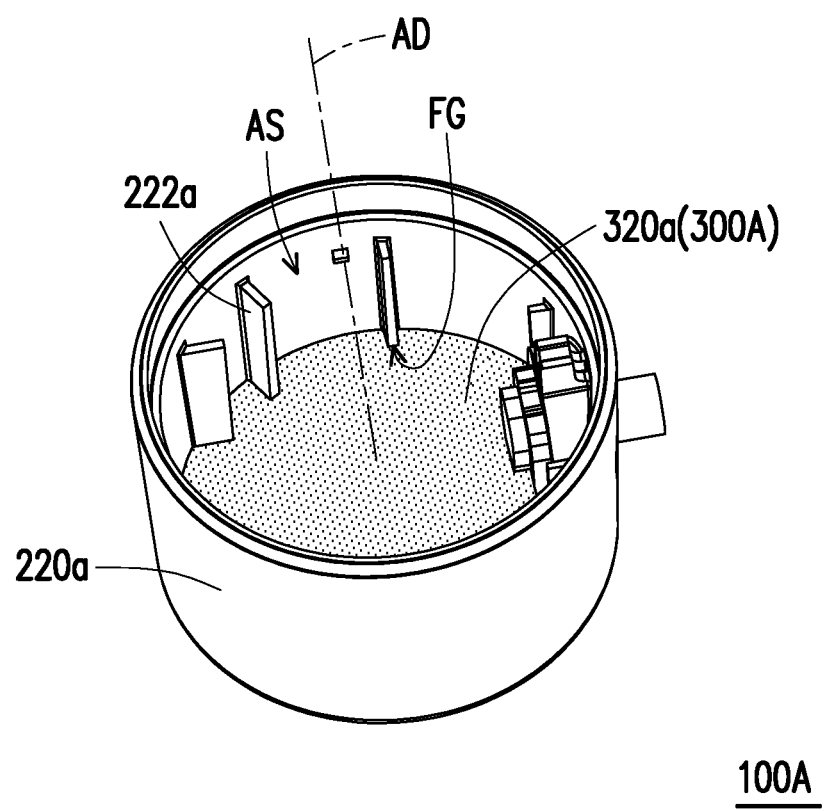
FIG. 3 is a schematic view of partial components of the waterproof electronic device according to another embodiment of the invention.

FIG. 3 is a schematic view of partial components of the waterproof electronic device according to another embodiment of the invention.

Referring to FIG. 1B and FIG. 3, a waterproof electronic device 100A of the present embodiment is similar to the waterproof electronic device 100 of FIG. 1B, and the difference is that a second case 220a of the waterproof electronic device 100A has at least one rib 222a (a plurality of ribs 222a as an example in FIG. 3) disposed on the second inner wall W2 and extended along the axial direction AD. A circuit board 320a of a power conversion unit 300A has a plurality of engaging grooves FG, and the plurality of engaging grooves FG of the circuit board 320a respectively and correspondingly accommodate the plurality of ribs 222a. Thus, the power conversion unit 300A is moved downward along the plurality of ribs 222a in the accommodation space AS to be positioned at the bottom of the second case 220a.

In summary, in the waterproof housing of the present invention, the waterproof unit is disposed in the groove located at the side wall of the first case. Since the joint direction of the welded member is different from the opening direction of the groove, when the welded member is subjected to ultrasonic vibration welding, the external force from the ultrasonic vibration on the waterproof unit is smaller, thereby improving the phenomenon of glue melting between the welded member and the first and second cases caused by heat generated by friction. Therefore, in the present invention, the waterproof unit is laterally disposed between the first case and the second case to reduce the influences of ultrasonic vibration and up and down pressing stress, so as to achieve the purposes of longer service life and better product yield.

Furthermore, in the present invention, the joint direction of the welded member is disposed along the axial direction of the waterproof case, and the opening direction of the groove accommodating the waterproof unit is not parallel to the joint direction. Thus, when the welded member is subjected to ultrasonic vibration welding, the axial frictional stress on the waterproof unit can be partially removed. The phenomenon of glue melting can be avoided compared with the prior art.

In addition, the groove of the first case is disposed on the outer side wall. The groove type of the first case can reduce the thickness dimension of the second case to save material. Also, it is possible to reduce the stress compression trace between the upper cover and the lower cover of the prior art.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A waterproof electronic device, comprising:
a waterproof housing, comprising:
a first case, comprising:
a side wall, disposed on an outer periphery of the first case; and
a groove, disposed on the side wall;
a second case, disposed in correspondence with the first case, and the second case comprising:
a first inner wall, disposed at an inner side of the second case, the first inner wall and the side wall being disposed in correspondence with each other;
a welded member, disposed in correspondence with the first case and the second case, and a joint direction of the welded member being different from an opening direction of the groove, wherein an axial length of the welded member relative to a top surface of the first case is greater than an axial length of the groove relative to the top surface of the first case, and the welded member is located below the waterproof unit; and
a waterproof unit, disposed in the groove and partially protruded from the side wall; and a power conversion unit, disposed between the first case and the second case;

wherein the first case and the second case are jointed to each other via the welded member, and the first case and the second case form an accommodation space together, the power conversion unit is disposed in the accommodation space, and the waterproof unit and the first inner wall are abutted against each other for sealing the first case and the second case.

2. The waterproof electronic device according to claim 1, wherein the first case has a first welded surface disposed at a bottom of the side wall and toward the second case, the second case has a second welded surface disposed at a bottom of the first inner wall and aligned with the first welded surface.

3. The waterproof electronic device according to claim 2, wherein the welded member is disposed between the first welded surface and the second welded surface, and the welded member is jointed to the first welded surface and the second welded surface via ultrasonic welding.

4. The waterproof electronic device according to claim 2, wherein a first included angle is formed between the first welded surface and the side wall, and a second included angle is formed between the second welded surface and the first inner wall.

5. The waterproof electronic device according to claim 2, wherein a bottom surface of the first case is formed with a positioning block, and the positioning block is vertically extended toward the second case and protruded from the first welded surface.

6. The waterproof electronic device according to claim 5, wherein the second case has a positioning groove disposed in the second case and located below the first inner wall, and the positioning groove correspondingly accommodates the positioning block to position the first case.

7. The waterproof electronic device according to claim 1, wherein the second case has a second inner wall, the second inner wall is connected to the first inner wall and away from the first case, and an inner diameter of the second inner wall is smaller than and is gradually tapered away from an inner diameter of the first inner wall.

8. The waterproof electronic device according to claim 7, wherein the second case has at least one rib disposed on the second inner wall, and the at least one rib is extended on the second inner wall along an axial direction, so that two ends of each of the at least one rib is respectively adjacent to an edge of the first inner wall and a bottom surface of the second case.

9. The waterproof electronic device according to claim 8, wherein each of the at least one rib and the edge of the first inner wall have an accommodation groove therebetween, a length dimension of the accommodation groove corresponds with a thickness dimension of a circuit board of the power conversion unit, after the first case and the second case are jointed to each other, the rib and the first case are configured to clamp and fix the circuit board of the power conversion unit.

10. The waterproof electronic device according to claim 7, wherein the second case has at least one rib disposed on the second inner wall and extended along an axial direction.

11. The waterproof electronic device according to claim 10, wherein the power conversion unit has at least one engaging groove, the at least one engaging groove of the power conversion unit correspondingly accommodates the at least one rib, so that the power conversion unit is positioned at a bottom of the second case along the at least one rib.

12. A waterproof housing, comprising:
a first case, comprising:
a side wall, disposed on an outer periphery of the first case; and
a groove, disposed on the side wall;
a second case, disposed in correspondence with the first case, and the second case comprising:
a first inner wall, disposed at an inner side of the second case, the first inner wall and the side wall being disposed in correspondence with each other;
a welded member, disposed in correspondence with the first case and the second case, and a joint direction of the welded member being different from an opening direction of the groove, wherein an axial length of the welded member relative to a top surface of the first case is greater than an axial length of the groove relative to the top surface of the first case, and the welded member is located below the waterproof unit; and
a waterproof unit, disposed in the groove and partially protruded from the side wall;
wherein the first case and the second case are jointed to each other via the welded member, and the waterproof unit and the first inner wall are abutted against each other for sealing the first case and the second case.

13. The waterproof housing according to claim 12, wherein the first case has a first welded surface disposed at a bottom of the side wall and toward the second case, the second case has a second welded surface disposed at a bottom of the first inner wall and aligned with the first welded surface.

14. The waterproof housing according to claim 13, wherein the welded member is disposed between the first welded surface and the second welded surface, and the welded member is jointed to the first welded surface and the second welded surface via ultrasonic welding.

15. The waterproof housing according to claim 13, wherein a first included angle is formed between the first welded surface and the side wall, and a second included angle is formed between the second welded surface and the first inner wall.

16. The waterproof housing according to claim 15, wherein a bottom surface of the first case is formed with a positioning block, and the positioning block is vertically extended toward the second case and protruded from the first welded surface.

17. The waterproof housing according to claim 16, wherein the second case has a positioning groove disposed in the second case and located below the first inner wall, and the positioning groove correspondingly accommodates the positioning block to position the first case.

18. The waterproof housing according to claim 12, wherein the second case has a second inner wall, the second inner wall is connected to the first inner wall and away from the first case, and an inner diameter of the second inner wall is smaller than and is gradually tapered away from an inner diameter of the first inner wall.

* * * * *